(12) United States Patent
Eswaran et al.

(10) Patent No.: US 12,395,168 B2
(45) Date of Patent: Aug. 19, 2025

(54) BIPOLAR GATE DRIVE SYSTEMS

(71) Applicant: Hamilton Sundstrand Corporation, Charlotte, NC (US)

(72) Inventors: Pravinsharma Kaliyannan Eswaran, Bangalore (IN); Nageswara Rao Kalluri, Bangalore (IN); Surendra Somasekhar Valleru, Bangalore (IN); Sridhar Katakam, Bangalore (IN); Rajkumar Perumal, Bangalore (IN)

(73) Assignee: Hamilton Sundstrand Corporation, Charlotte, NC (US)

( * ) Notice: Subject to any disclaimer, the term of this patent is extended or adjusted under 35 U.S.C. 154(b) by 196 days.

(21) Appl. No.: 18/135,676

(22) Filed: Apr. 17, 2023

(65) Prior Publication Data

US 2023/0344426 A1    Oct. 26, 2023

(30) Foreign Application Priority Data

Apr. 26, 2022 (IN) ............................. 202241024476

(51) Int. Cl.
*H03K 17/567* (2006.01)
*H02P 27/06* (2006.01)
*H03K 17/687* (2006.01)

(52) U.S. Cl.
CPC ......... *H03K 17/567* (2013.01); *H03K 17/687* (2013.01); *H02P 27/06* (2013.01)

(58) Field of Classification Search
CPC ..... H03K 17/567; H03K 17/687; H02P 27/06
See application file for complete search history.

(56) References Cited

U.S. PATENT DOCUMENTS

| 7,688,147 | B1 | 3/2010 | Hoover |
| 2010/0141304 | A1* | 6/2010 | Miyazaki ............... H03K 17/06 327/109 |
| 2018/0159418 | A1 | 6/2018 | Basu et al. |
| 2019/0036522 | A1 | 1/2019 | Ohashi |

FOREIGN PATENT DOCUMENTS

| EP | 2164155 A1 | 3/2010 |
| EP | 3895300 A1 | 10/2021 |
| JP | 2020039204 A | 3/2020 |

OTHER PUBLICATIONS

Extended European Search Report, of the European Patent Office, dated Sep. 22, 2023, in corresponding European Patent Application No. 23169867.1.

\* cited by examiner

*Primary Examiner* — Zoheb S Imtiaz

(57) ABSTRACT

A switch control system can include a voltage source configured to output a source voltage on a voltage line, and a first gate driver connected to a gate control signal line to receive a gate control signal from a controller. The first gate driver can be connected to the voltage line to receive the source voltage, and the first gate driver can be connected to a first terminal line to output a first gate voltage signal to a first terminal of a switch. The system can include an inverter connected to the gate control signal line configured to receive the gate control signal and output an inverted gate control signal. The system can include a second gate driver connected to the inverter to receive the inverted gate control signal from the inverter. The second gate driver can be connected to the voltage line to receive the source voltage, and the second gate driver can be connected to a second terminal line to output a second gate voltage signal to a second terminal of a switch.

20 Claims, 2 Drawing Sheets

BIPOLAR GATE DRIVE SYSTEMS

CROSS-REFERENCE TO RELATED APPLICATIONS

This application claims priority to Indian Provisional Patent Application No. 202241024476, filed Apr. 26, 2022, the disclosure of which is incorporated by reference herein in its entirety.

FIELD

This disclosure relates to bipolar gate drive systems, e.g., for power switches.

BACKGROUND

In many three phase AC/DC input fed motor drive applications, a power switch (e.g., an IGBT, a MOSFET) is common component across different functionalities like inrush control, inverter control and regeneration control. Though functionalities are different for each power switch, the operation of the switches can be the same. The power switch can be expected to operate in cut-off/saturation region (ON/OFF). To enable a power switch to operate in ON/OFF states, appropriate gate to source/emitter voltage is essential (e.g., using a gate driver (GD) since a gate pin is common across IGBTs or MOSFETs).

Traditional systems can employ a bipolar arrangement. The traditional approach of implementing bipolar gate drive employs a commercial off the shelf (COTS) bipolar power gate driver which accepts bipolar voltage rails connected to two separate voltage sources. The bipolar voltages (+VCC_GD, −VCC_GD) are generated from two separate gate drive power supplies. The gate driver (GD1) converts a gate control signal from a controller into a bipolar output voltage (either +VCC_GD or −VCC_GD) which turns a switch ON or OFF.

Having a dual power supply arrangement makes the gate drive power more complex, bulky, and unreliable. Accommodating these dual supplies for each gate drive and their isolation from each other can be very difficult.

Such conventional methods and systems have generally been considered satisfactory for their intended purpose. However, there is still a need in the art for improved bipolar gate drive systems. The present disclosure provides a solution for this need.

SUMMARY

A switch control system can include a voltage source configured to output a source voltage on a voltage line, and a first gate driver connected to a gate control signal line to receive a gate control signal from a controller. The first gate driver can be connected to the voltage line to receive the source voltage, and the first gate driver can be connected to a first terminal line to output a first gate voltage signal to a first terminal of a switch. The system can include an inverter connected to the gate control signal line configured to receive the gate control signal and output an inverted gate control signal. The system can include a second gate driver connected to the inverter to receive the inverted gate control signal from the inverter. The second gate driver can be connected to the voltage line to receive the source voltage, and the second gate driver can be connected to a second terminal line to output a second gate voltage signal to a second terminal of a switch.

For example, the first terminal of the switch can be a gate. The second terminal of the switch can be a source or emitter. In certain embodiments, the first gate voltage signal and the second gate voltage signal can be exactly inverted to cause gate voltage at the switch to be bipolar.

In certain embodiments, each of the first gate driver and the second gate driver can be connected to a ground via a ground line. Each gate driver can be configured to selectively output the source voltage (e.g., +VCC_GD) or ground voltage (e.g., 0V) as a function of the gate control signal from the controller.

In certain embodiments, when the output of the first gate driver is the source voltage, the output of the second gate driver can be ground voltage such that the gate of the switch is connected to the source voltage and the source or emitter of the switch is connected to ground voltage. Also, when the output of the first gate driver is the ground voltage, the output of the second gate driver can be the source voltage such that the gate of the switch is connected to the ground voltage and the source or emitter of the switch is connected to source voltage.

Certain embodiments of the system can include the switch. For example, the switch can be a MOSFET or an IGBT. Any other suitable switch type and/or terminal types are contemplated herein.

In certain embodiments, the first gate driver and the second gate driver can be integrated in a single integrated circuit such that the system includes a single voltage line to the single integrated circuit and a single ground line from the integrated circuit. In certain embodiments, the first gate driver and the second gate driver can be hosted on separate integrated circuits such that the system includes a two voltage line branches and two ground line branches.

In accordance with at least one aspect of this disclosure, an electric motor control assembly can include a switch control system. The switch control system can be any suitable system disclosed herein, e.g., as described above.

In accordance with at least one aspect of this disclosure, a method can include providing a bipolar gate drive voltage to a switch using a single voltage source. In certain embodiments, providing the bipolar gate drive voltage can include applying a high signal to a gate of the switch and a low signal to a source or emitter of a switch in a first state, and providing a low signal to the gate of the switch and a high signal to the source or emitter of the switch in a second state. The method can include any other suitable method(s) and/or portion(s) thereof.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
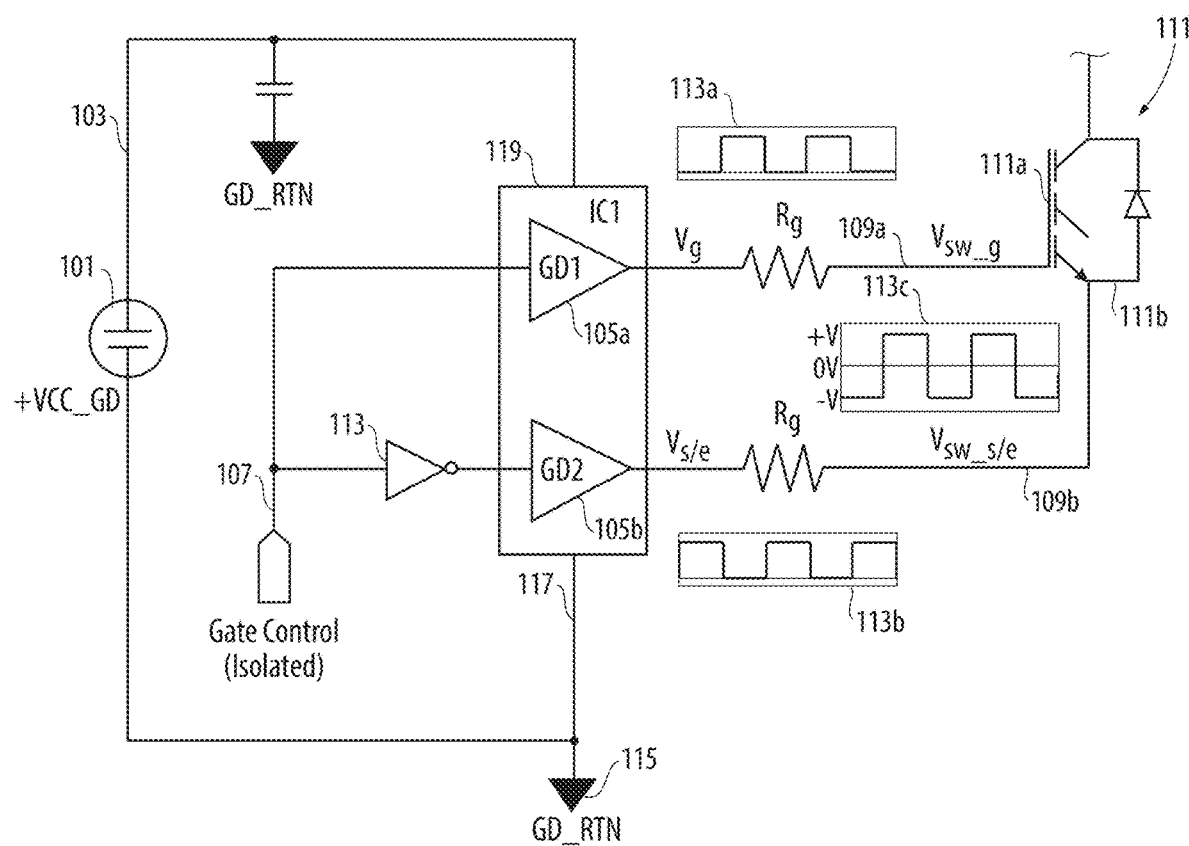
FIG. 1 is a schematic circuit diagram of an embodiment of a system in accordance with this disclosure.
Figure 2:
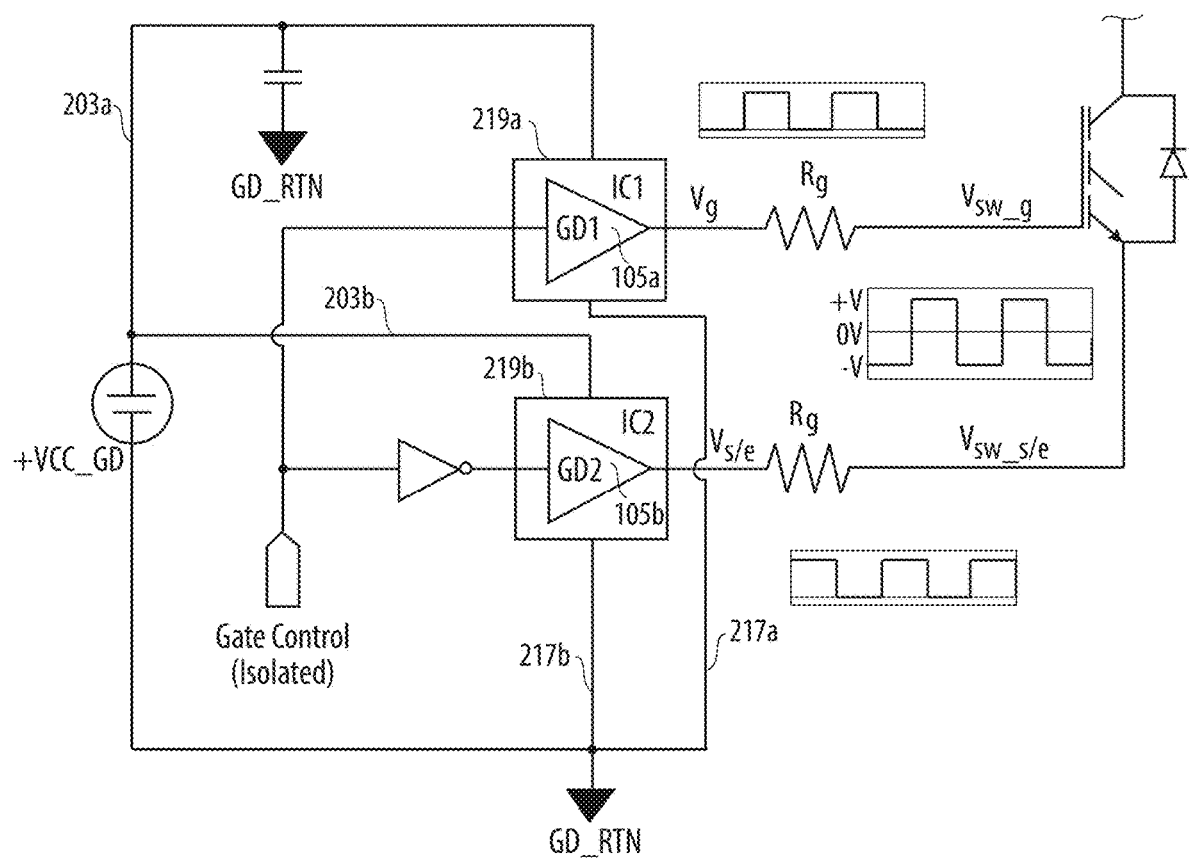
FIG. 2 is a schematic circuit diagram of another embodiment of a system in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIG. 2. Certain embodiments described herein can be used to provide bipolar gate voltage to a switch with a single voltage source, for example.

Referring to FIG. 1, for example, a switch control system 100 can include a voltage source 101 configured to output a source voltage (e.g., +VCC_GD) on a voltage line 103, and a first gate driver 105a connected to a gate control signal line 107 to receive a gate control signal from a controller (not shown). The first gate driver 105a can be connected to the voltage line 103 to receive the source voltage, and the first gate driver 105a can be connected to a first terminal line 109 to output a first gate voltage signal (e.g., signal 113a, Vg) to a first terminal 111a (e.g., a gate) of a switch 111.

The system 100 can include an inverter 113 connected to the gate control signal line 107 and configured to receive the gate control signal and output an inverted gate control signal. The system 100 can include a second gate driver 105b connected to the inverter 113 to receive the inverted gate control signal from the inverter. The second gate driver 105b can be connected to the voltage line 103 to receive the source voltage, and the second gate driver 105b can be connected to a second terminal line 109b to output a second gate voltage signal (e.g., signal 113b, Vs/e) to a second terminal 111b of the switch 111.

For example, the first terminal 111a of the switch 111 can be a gate (e.g., as shown). The second terminal 111b of the switch 111 can be a source or emitter (e.g., as shown). In certain embodiments, the first gate voltage signal 113a and the second gate voltage signal 113b can be exactly inverted (e.g., as schematically shown) to cause gate voltage 113c at the switch 111 to be bipolar.

In certain embodiments, each of the first gate driver 105a and the second gate driver 105b can be connected to a ground 115 via a ground line 117. Each gate driver 105a, 105b can be configured to selectively output the source voltage (e.g., +VCC_GD) or ground voltage (e.g., 0V) as a function of the gate control signal from the controller.

In certain embodiments, for example, when the output of the first gate driver 105a is the source voltage, the output of the second gate driver 105b can be ground voltage such that the gate (e.g., first terminal 111a) of the switch 111 is connected to the source voltage and the source or emitter (e.g., second terminal 111b) of the switch 111 is connected to ground voltage. Also, when the output of the first gate driver 105a is the ground voltage, the output of the second gate driver 105b can be the source voltage such that the gate of the switch 111 can be connected to the ground voltage and the source or emitter of the switch 111 is connected to source voltage, e.g., thereby creating a bipolar voltage condition. In either scenario, the magnitude of the gate voltage can be about that of the source voltage, but can be either positive or negative depending on the which driver is outputting the high signal and which driver is outputting the low signal.

Certain embodiments of the system 100 can include the switch 111. For example, the switch can be a MOSFET or an IGBT. Any other suitable switch type and/or terminal types are contemplated herein.

In certain embodiments, as shown in FIG. 1, the first gate driver 105a and the second gate driver 105b can be integrated in a single integrated circuit 119 such that the system 100 includes a single voltage line 103 to the single integrated circuit 119 and a single ground line 117 from the integrated circuit 119. The drivers 105a, 105b, and/or the integrated circuit 119 can include any suitable hardware and/or software module(s) configured to perform the associated function.

In certain embodiments, as shown in the system 200 of FIG. 2 the first gate driver 105a and the second gate driver 105b can be hosted on separate integrated circuits 219a, 219b such that the system 200 includes a two voltage line branches 203a, 203b and two ground line branches 217a, 217b. The system 200 can otherwise be similar to the system 100 as disclosed above.

Any other suitable arrangement of components (e.g., integration, federation, or location) to provide bipolar gate voltage with a single voltage source is contemplated herein. Any other suitable additional circuit components (e.g., resistors as shown have same values Rg, a capacitor connected between ground and the voltage line, etc.) are contemplated herein. In certain embodiments, the gate drivers can be the same components and can be COTS devices, for example.

In accordance with at least one aspect of this disclosure, an electric motor control assembly can include a switch control system. The switch control system can be any suitable system disclosed herein, e.g., system 100, 200 as described above.

In accordance with at least one aspect of this disclosure, a method can include providing a bipolar gate drive voltage to a switch using a single voltage source. In certain embodiments, providing the bipolar gate drive voltage can include applying a high signal to a gate of the switch and a low signal to a source or emitter of a switch in a first state, and providing a low signal to the gate of the switch and a high signal to the source or emitter of the switch in a second state. The method can include any other suitable method(s) and/or portion(s) thereof.

In embodiments, the output of the first gate driver and the first gate driver can always be opposite. Embodiments can allow use of a unipolar source and to provide bipolar control.

Embodiments can provide a method for symmetrical bipolar output voltage with a single supply gate driver. Embodiments can generate bipolar gate emitter/source voltage (±Vge/±Vgs) using a unipolar/single supply gate driver as shown in FIG. 1. In certain embodiments, the input to one of the two channels of a COTS gate driver can be given to a gate control signal (from a controller) and a second channel can be given an inverted signal of same gate signal. The output of the first channel Vg, (e.g., which can be referenced to power supply GND_RTN) can be connected to gate of the power switch (MOSFET/IGBT) and the output of the second gate driver, Ve/s (e.g., which can also be referenced to power supply GND_RTN) can be connected to emitter/source of the power switch (MOSFET/IGBT). The differential voltage between Vg and Ve/s gives the differential voltage which is bi-polar in nature (±volts). This technique can be used for any COTS gate driver with two channels available, and also with single channel gate drivers which is shown in the FIG. 2. In the latter case, two gate drivers can be used to generate the differential voltage. Since the same input signal is passed to both gate drive channels, the propagation delay can also be same.

Table 1 below shows an embodiment of a gate input and gate drive output logic.

TABLE 1

Gate Input and Gate Drive Output Logic Table

| Input Signal to Gate driver (Gate control-isolated) | Gate channel-1 output (Vg) | Gate channel-2 output (Ve/s) | Final output (Vge/Vgs) |
|---|---|---|---|
| Logic High (5 V/3.3 V) | VCC_GD | GD_RTN (0V) | +VCC_GD |
| Logic low (0 V) | GD_RTN (0V) | VCC_GD | −VCC_GD |

In certain embodiments, under a fault of a gate driver (e.g., 2 channels in a single IC/chip), both outputs fail the same way (fail open or fail short) and avoids the gate driver not to turn ON unintentionally because both outputs produce same voltage and hence zero differential voltage across the gate to emitter/source.

In certain embodiments, under a fault of the inverter, the system can either fail short (0V) where the power switch will follow input gate control signal, but does not get bipolar voltage and device operates in unipolar drive, or fail open (High) where the power switch will never turn ON with input gate control signal. Neither scenario creates a unsafe condition.

This type of bipolar gate voltage can also be generated by having two separate totem pole outputs operated in complementary fashion with discrete gate driver solution too. But embodiments can simplify the overall approach by removing the output complementary totem pole devices and implementing digital inversion which can reduce cost, space, and remove dependency of special complementary output devices. And also, this solution is free from obsolescence as these digital inverters and gate drivers are available off the shelf from many suppliers. Also this approach reduces the shoot through (at their totem pole output switches during transitions) driver with suppliers expertise in achieving the controlled parameters of the output drive states.

Embodiments can allow simple and easy implementation with a single power supply rail, can have no custom design power supplies or gate drives, and can have no single point failure which turns ON the power switch unintentionally. The dual channel low side gate driver can be beneficial over single channel gate drivers in terms of cost and space. Adding an additional channel for generating bipolar gate drive signal can be very beneficial in overall solution. Embodiments that us digital side inversion can be more easily made, robust, and cost effective compared with output side additional pairs of complementary totem pole output which requires careful component selection which leads to obsolescence risks In certain embodiments, all power supplies for a three phase inverter (e.g., a motor drive application for example) can be generated using a single fly-back/forward converter.

Embodiments generate Bipolar gate voltage for Power switch (IGBT/MOSFET) using a single Supply with unipolar/single supply gate drives. The input gate signal can be given to the one of the two channel gate driver and inverted signal of same input gate signal can be given to another gate drive channel. The output voltage across the gate driver outputs can be differential signal which gives a bipolar output. This technique can be used for any COTS gate driver part. Since the input signal is passed to both gate drive channels the propagation delay also will be same.

Embodiments can include any suitable computer hardware and/or software module(s) to perform any suitable function (e.g., as disclosed herein).

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN)

or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A switch control system, comprising:
  a voltage source configured to output a source voltage on a voltage line;
  a first gate driver connected to a gate control signal line to receive a gate control signal from a controller, wherein the first gate driver is connected to the voltage line to receive the source voltage, wherein the first gate driver is connected to a first terminal line to output a first gate voltage signal to a first terminal of a switch;
  an inverter connected to the gate control signal line and configured to receive the gate control signal and output an inverted gate control signal; and
  a second gate driver connected to the inverter to receive the inverted gate control signal from the inverter, wherein the second gate driver is connected to the voltage line to receive the source voltage, wherein the second gate driver is connected to a second terminal line to output a second gate voltage signal to a second terminal of the switch;
  wherein:
    the first gate driver and the second gate driver are integrated in a single integrated circuit such that the switch control system includes a single voltage line to the single integrated circuit and a single ground line from the integrated circuit; or
    the first gate driver and the second gate driver are hosted on separate integrated circuits such that the switch control system includes two voltage line branches and two ground line branches.

2. The system of claim 1, wherein the first terminal is a gate.

3. The system of claim 2, wherein the second terminal is a source or emitter.

4. The system of claim 3, wherein the first gate voltage signal and the second gate voltage signal are exactly inverted to cause gate voltage at the switch to be bipolar.

5. The system of claim 4, wherein each of the first gate driver and the second gate driver is connected to a ground via a ground line, wherein each gate driver is configured to selectively output the source voltage or a ground voltage as a function of the gate control signal from the controller.

6. The system of claim 5, wherein:
when the output of the first gate driver is the source voltage, the output of the second gate driver is the ground voltage such that the gate of the switch is connected to the source voltage and the source or emitter of the switch is connected to the ground voltage, and
when the output of the first gate driver is the ground voltage, the output of the second gate driver is the source voltage such that the gate of the switch is connected to the ground voltage and the source or emitter of the switch is connected to the source voltage.

7. The system of claim 6, further comprising the switch.

8. The system of claim 7, wherein the switch is a MOSFET or an IGBT.

9. The system of claim 1, wherein the first gate driver and the second gate driver are integrated in the single integrated circuit such that the switch control system includes the single voltage line to the single integrated circuit and the single ground line from the integrated circuit.

10. The system of claim 1, wherein the first gate driver and the second gate driver are hosted on the separate integrated circuits such that the switch control system includes the two voltage line branches and the two ground line branches.

11. An electric motor control assembly, comprising:
a switch control system, comprising:
a voltage source configured to output a source voltage on a voltage line;
a first gate driver connected to a gate control signal line to receive a gate control signal from a controller, wherein the first gate driver is connected to the voltage line to receive the source voltage, wherein the first gate driver is connected to a first terminal line to output a first gate voltage signal to a first terminal of a switch;
an inverter connected to the gate control signal line and configured to receive the gate control signal and output an inverted gate control signal; and
a second gate driver connected to the inverter to receive the inverted gate control signal from the inverter, wherein the second gate driver is connected to the voltage line to receive the source voltage, wherein the second gate driver is connected to a second terminal line to output a second gate voltage signal to a second terminal of the switch;
wherein:
the first gate driver and the second gate driver are integrated in a single integrated circuit such that the switch control system includes a single voltage line to the single integrated circuit and a single ground line from the integrated circuit; or
the first gate driver and the second gate driver are hosted on separate integrated circuits such that the switch control system includes two voltage line branches and two ground line branches.

12. The assembly of claim 11, wherein the first terminal is a gate.

13. The assembly of claim 12, wherein the second terminal is a source or emitter.

14. The assembly of claim 13, wherein the first gate voltage signal and the second gate voltage signal are exactly inverted to cause gate voltage at the switch to be bipolar.

15. The assembly of claim 14, wherein each of the first gate driver and the second gate driver is connected to a ground via a ground line, wherein each gate driver is configured to selectively output the source voltage or a ground voltage as a function of the gate control signal from the controller.

16. The assembly of claim 15, wherein;
when the output of the first gate driver is the source voltage, the output of the second gate driver is the ground voltage such that the gate of the switch is connected to the source voltage and the source or emitter of the switch is connected to the ground voltage, and
when the output of the first gate driver is the ground voltage, the output of the second gate driver is the source voltage such that the gate of the switch is connected to the ground voltage and the source or emitter of the switch is connected to the source voltage, thereby creating a bipolar voltage condition.

17. The assembly of claim 16, further comprising the switch.

18. The assembly of claim 17, wherein the switch is a MOSFET or an IGBT.

19. A method, comprising:
providing a bipolar gate drive voltage to a switch using a switch control system, the switch control system comprising:
a voltage source configured to output a source voltage on a voltage line;
a first gate driver connected to a gate control signal line to receive a gate control signal from a controller, wherein the first gate driver is connected to the voltage line to receive the source voltage, wherein the first gate driver is connected to a first terminal line to output a first gate voltage signal to a first terminal of the switch;
an inverter connected to the gate control signal line and configured to receive the gate control signal and output an inverted gate control signal; and
a second gate driver connected to the inverter to receive the inverted gate control signal from the inverter, wherein the second gate driver is connected to the voltage line to receive the source voltage, wherein the second gate driver is connected to a second terminal line to output a second gate voltage signal to a second terminal of the switch;
wherein:
the first gate driver and the second gate driver are integrated in a single integrated circuit such that the switch control system includes a single voltage line to the single integrated circuit and a single ground line from the integrated circuit; or
the first gate driver and the second gate driver are hosted on separate integrated circuits such that the switch control system includes two voltage line branches and two ground line branches.

20. The method of claim 19, wherein providing the bipolar gate drive voltage includes:
applying a high signal to a gate of the switch and a low signal to a source or emitter of a switch in a first state, and
providing a low signal to the gate of the switch and a high signal to the source or emitter of the switch in a second state.

* * * * *